Feb. 25, 1969 JAMES E. WEBB 3,430,115

ADMINISTRATOR OF THE NATIONAL AERONAUTICS
AND SPACE ADMINISTRATION

APPARATUS FOR BALLASTING HIGH FREQUENCY TRANSISTORS

Filed Aug. 31, 1966 Sheet 1 of 2

INVENTOR
George J. Gilbert

BY

ATTORNEYS

INVENTOR
George J. Gilbert

BY

ATTORNEYS

United States Patent Office 3,430,115
Patented Feb. 25, 1969

3,430,115
APPARATUS FOR BALLASTING HIGH FREQUENCY TRANSISTORS

James E. Webb, Administrator of the National Aeronautics and Space Administration with respect to an invention of George J. Gilbert, Hunterdon, N.J.

Filed Aug. 31, 1966, Ser. No. 576,797
U.S. Cl. 317—235 2 Claims
Int. Cl. H01l 1/14

ABSTRACT OF THE DISCLOSURE

A contract and lead arrangement for multiple junction planar transistors comprising a plurality of separate leads connected one for one to each U-shaped contact member of each of a plurality of pairs of interleaved U-shaped contact members, wherein the length of each separate lead is predetermined to provide a desired value of inductance at the operation frequency.

The invention described herein was made in the performance of work under an NASA contract and is subject to the provisions of Section 305 of the National Aeronautics and Space Act of 1958, Public Law 85–568 (72 Stat. 435; 42 USC 2457).

This invention relates to transistor contacts and more particularly to a method and apparatus for making ballast contacts to high frequency transistors.

Recent advances in transistor technology have resulted in the development of high frequency and high power transistors. The operation frequency of these devices is in the mid-to-upper megacycle range, and above. Their operating power is in the tens of watt range. One such recently developed transistor is the overlay transistor. The overlay transistor comprises a plurality of base-emitter junctions connected in parallel. The plurality of junctions provides for high power while at the same time reducing the barrier capacitance of the device. The reduction in barrier capacitance provides for high frequency operation. A description of various types of overlay transistors is contained in three articles in "Electronics," vol. 38, No. 17, pages 70–84, published by McGraw-Hill, Inc.

Contact with the emitter and base regions of an overlay or multiple junction transistor is achieved by the appropriate vaporization and etching of a metal onto a surface of the overall semiconductive body. In many such devices the silhouette of both the base and the emitter contacts is a comb. The transistor junctions are connected to the teeth of the comb, and electrical contacts adapted to be connected to other electrical elements are made to the back or stripe of the comb. Hence, the comb provides a means for making contact to the semiconductive regions in multiple junction transistors.

While comb contacts have found widespread use in multiple junction transistors they have not always been entirely satisfactory. Specifically, it has been found that multiple junction transistors have electrical parameters that vary from junction to junction. These variations may occur either when the transistor is formed or during the transistor life. In the former case the variations occur because of fabrication techniques that are not exactly uniform; in the latter case the variations occur because the junction characteristics deteriorate or change at different rates. Because of this different electrical parameter condition the junctions pass an uneven distribution of current. This uneven distribution of current may result in one or more of the junctions drawing a destructive amount of current. Hence, the multiple junction transistor has been found to be subject to early failure if some means is not utilized to ballast or evenly distribute current through the device.

The prior art has recognized this problem and has utilized resistance ballasting to aid in evenly distributing current. Generally, resistance ballasting or resistance stabilizing of overlay transistors comprises the depositing of a resistor at each tip of the comb teeth. A connecting wire is also attached to each tip. While resistance ballasting has found widespread use it has not proven to be entirely satisfactory. Specifically, it is complicated due to the requirement of adding resistance and wires to the ends of the teeth of a comb connector. Further, increasing the resistance of a current generating device inherently reduces its gain.

Therefore, it is an object of this invention to provide a new and improved method of contacting the semiconductor regions of a multiple junction transistor.

It is a further object of this invention to provide a new and improved method of contacting the emitter and base regions of a multiple junction transistor so that the current applied to the junctions is evenly distributed.

It is further object of this invention to provide a new and improved method of making contact with the regions of a multiple junction transistor to distribute the current evenly to said multiple junctions without affecting the gain of the transistor by adding resistance.

It is a still further object of this invention to provide a new and improved apparatus for making contact with the semiconductive regions of a multiple junction transistor.

It is a still further object of this invention to provide a new and improved apparatus for making contact with the emitter and base regions of a multiple junction transistor without substantially affecting the gain of the device.

In accordance with a principle of the invention a new and improved method of making contact with the multiple semiconductor regions of a multiple junction transistor is accomplished by increasing the inductive effect of the leads connected to the regions without increasing the overall lead inductance of the transistor. Distributing lead inductance results in a device wherein the lead voltage drop increases as the current flowing through the leads increases. That is, if the current passing ability of one or more junctions increases the voltage drop in the lead connected to that junction or junctions also increases. This lead voltage drop compensates for the increased current passing ability of the junction. Hence, the method of the invention results in controlling the current flowing through the high current junction to prevent it from passing a destructive amount of current.

In accordance with a further principle of the invention the foregoing method is accomplished by breaking a conventional comb contact structure into several separate segments. By breaking the comb into several segments the inductance of the leads connected to each segment operates in accordance with the foregoing method to provide an additional voltage drop to the junctions to which the segment is connected if the junction starts to pass more current. The end result is an increased voltage drop to compensate for the current increase caused by a junction passing increased current. In this manner a simple means is provided for carrying out the method of the invention.

In accordance with a still further principle of the invention the foregoing method is accomplished by increasing the tooth length of a conventional comb structure. Specifically, a section of tooth that is unconnected to the semiconductive regions is provided between the connected portion of the teeth and the comb back. This section provides the compensating inductance. The length of the teeth forming the emitter contacts, the base contacts, or both the emitter and the base contacts can be increased to provide a compensating inductance.

It will be appreciated that the foregoing is a simple method and apparatus for preventing the destruction of junctions in a multiple junction transistor due to a junction "hogging" current.

The foregoing objects and many of the attendant advantages of this invention will become more readily appreciated as the same becomes better understood by reference to the following detailed description when taken in conjunction with the accompanying drawings wherein.

Figure 1:
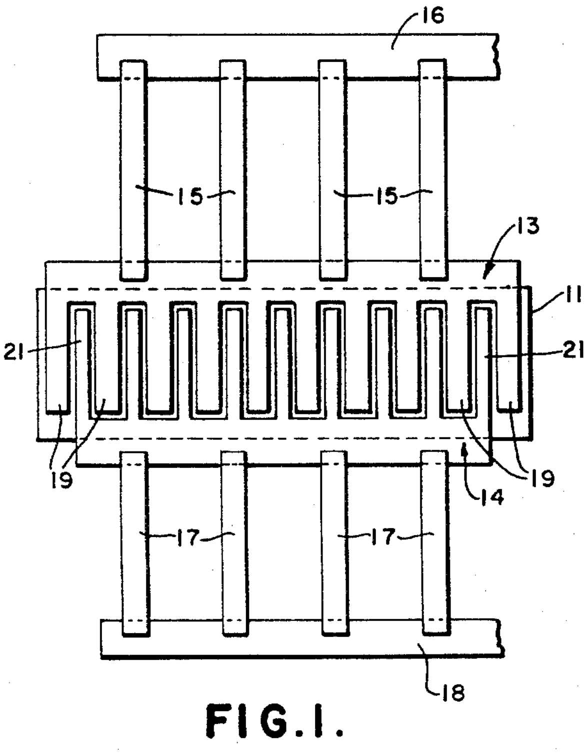
PRIOR ART FIG. 1.
FIG. 1 is a pictorial diagram illustrating a prior art comb type contact structure.

Turning now to the drawings wherein like reference numerals indicate like parts throughout the several views, FIG. 1 illustrates a prior art comb contact structure. The structure illustrated in FIG. 1 comprises a semiconductor structure 11, an emitter comb 13, and a base comb 14. A plurality of emitter leads 15 are connected between the back of the emitter comb 13 and an emitter terminal bar generally indicated at 16. Similarly, a plurality of base leads 17 are connected between the back of the base comb 14 and a base terminal bar generally indicated at 18. The plural leads provide for even current flow between the emitter and base combs and the terminal bars. However, because the terminal bars and the combs are unitary structures any impedance in the leads affects all of the junctions; i.e., it does not have an independent effect on individual junctions or groups of junctions.

The teeth 19 of the emitter comb extend over one face of the semiconductor structure 11 and are in contact with the emitters of the semiconductor structure as hereinafter described in conjunction with FIG. 2. Similarly, the teeth 21 of the base comb 14 extend over one face of the semiconductor structure 11 and are in contact with the base of the semiconductor structure. The teeth of the base comb are illustrated as fitting in between the teeth of the emitter comb. In this manner the prior art has provided a plurality of connections to a plurality of emitters and bases in a multiple junction planar transistor. It is this type of structure which has presented the problem of uneven current flow. That is, the junctions connected to the comb teeth have been found to draw different amounts of current either because of differences in specific junction structure created when the junctions are formed or because of differences in the rate of deterioration or change as the device is used. Differences in junction current flow have resulted in some junctions "hogging" the current. Because the junctions are small and unable to handle the increased current flow, this hogging has resulted in junction destruction.

Figure 2:
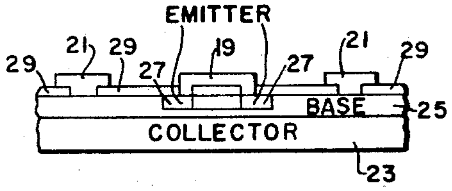
FIG. 2 is a partial cross section of a multiple junction structure illustrating how the comb contact teeth make contact with the semiconductive regions.

FIG. 2 illustrates the manner of connection between the teeth 19 of the emitter comb and the emitters of the semiconductor body 11 and between the teeth 21 of the base comb and the base of the semiconductor body. In general, a multiple junction semiconductor structure comprises a collector 23, a base 25, and a number of emitters 27. The collector 23 is a flat planar sheet of appropriately doped semiconductor material. Though not shown, the collector is normally connected to a metallic base which in turn is connected to a lead for external connection. The base is created on one face of the collector by any suitable means, such as doping for example. The emitters are then formed at suitable locations (in rows, for example) by doping the base. Thereafter the base and emitter combs are created on the base-emitter surface of the semiconductor body. One method of creating the combs is by evaporating aluminum onto the base-emitter face and then etching away a portion of the aluminum to create the comb configurations.

Between the fingers is an insulating layer 29. This insulating layer may be any conventional oxide such as silicon oxide and may be applied to the base-emitter face of the semiconductor body prior to the application of the aluminum to creates the comb contacts. If that procedure is used suitable portions of the insulating layer must be removed prior to applying the aluminum so that contact can be made with the emitters and the bases. In FIG. 2 the base finger is illustrated as a T cross-sectional configuration extending through the insulating layer 29 to the base 25. The emitter connection is illustrated as an inverted U wherein the legs of the U make connections with the emitters. There may be a plurality of emitters located along each tooth of the emitter comb. The foregoing and similar structures are more fully discussed in the articles in "Electronics" referred to above; it is this general type of transistor structure with which the invention is concerned.

Figure 3:
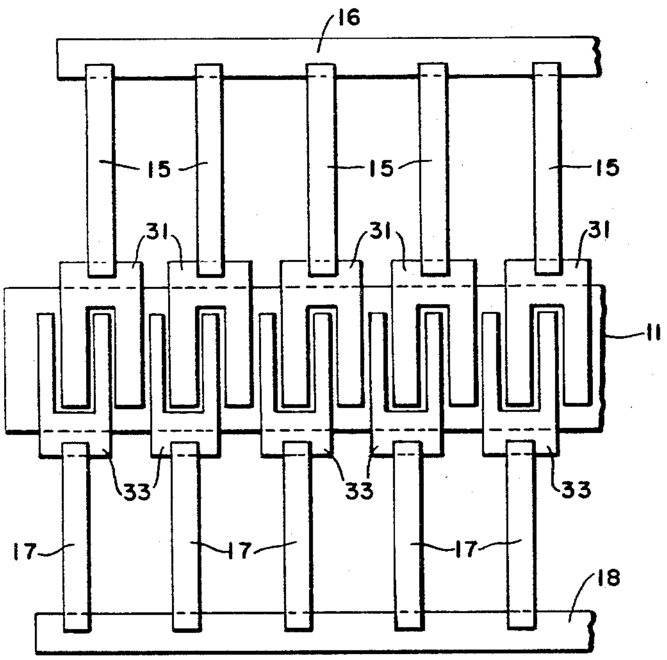
FIG. 3 is a pictorial diagram illustrating one embodiment of the invention.

FIG. 3 illustrates one embodiment of the invention used to reduce the detrimental current hogging effects of some junctions of a multiple junction transistor. In FIG. 3 both the emitter comb and the base comb have been divided into a plurality of segments. The emitter comb comprises segments 31. An emitter lead 15 is connected between each segment 31 and the emitter terminal bar 16. Similarly, the base comb is divided into segments 33. A base lead 17 is connected between each segment 33 and the base terminal bar 18. The combs extend over the semiconductor body 11 and are in contact with the base and emitter sections of the semiconductor structure in the manner illustrated in FIG. 2, for example.

As illustrated in FIG. 3, each individual emitter and base comb segment comprises a U-shaped member with one leg of each U fitting into the aperture of an opposing U. That is, one leg of an emitter member fits into the aperture of a base member and one leg of the base member fits into an aperture of the emitter member. However, this segmental layout is only by way of example and other segmental layouts to which the invention applies will be obvious to those skilled in the art.

It has been found that a structure of the type illustrated in FIG 3 results in an inductive effect for reducing increased current when one or more of the emitter-base junctions draws more than a desired amount of current. In one operable multijunction transistor of the type illustrated in FIG. 3 each segment draws approximately 100 milliamps of current when operated at a high level. An emitter or base lead 40 mils in length and 1 mil in diameter has an inductance of 1 nanohenry. The inductive reactance of such a lead at 430 megacycles is 2.5 ohms. Hence, if one segment starts to draw 25 milliamps more than another segment a 62 millivolt additional voltage drop occurs in the emitter lead alone. An additional voltage drop will occur in the base lead. It is this additional voltage drop that ballasts the transistor to eliminate the current hogging problem. That is, this potential difference across the emitter-base junction is lowered, due to the increased voltage drop across the leads, sufficiently to prevent the segment attempting to hog current from drawing any further current.

Figures 4, 5:
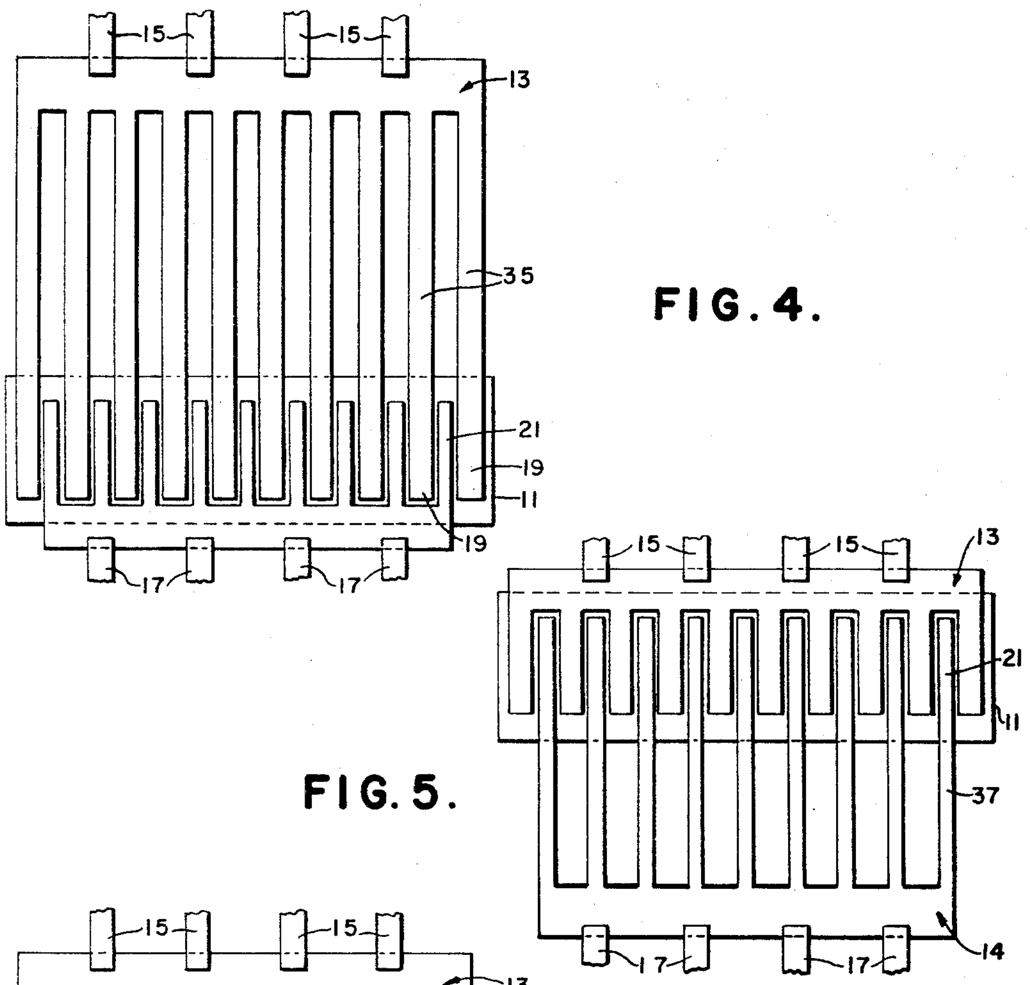
FIG. 4 is a pictorial diagram illustrating a second embodiment of the invention.
FIG. 5 is a pictorial diagram illustrating a third embodiment of the invention.

FIG. 4 illustrates an alternative embodiment of the invention. In FIG. 4 the emitter and base combs are not segmented. However, the teeth 19 of the emitter comb 13 are considerably longer than the teeth illustrated in FIG. 1. It is this increase in emitter comb tooth length that provides the ballasting inductance which eliminates the detrimental effects of a junction hogging current.

Specifically, the structure illustrated in FIG. 4 comprises an emitter comb 13 having a plurality of extended teeth 19. A plurality of leads 15 are connected to the back of the emitter comb 13. Preferably, these leads extend to an emitter terminal bar of the type illustrated in FIGS. 1 and 3. The base comb 14 is similar to that illustrated in FIG. 1 and comprises a plurality of relatively short teeth 21. Base leads 17 are connected to the back of the base comb 14. Preferably, these leads extend to a base terminal bar. The teeth of the base comb and the ends of the teeth of the emitter comb interlock in the manner illustrated in FIG. 1. There is a length 35 of the teeth of the emitter comb 13 between the back of that comb and its point of connection to the emitters of the semiconductor 11. It is this tooth length which provides the desired inductance. The tooth length 35 determines the amount of increased inductance which occurs when a junction hogs current. In a manner similar to that described in connection with FIG. 3, when a junction hogs current increased ballasting inductance results in an increased voltage drop across the emitter-base connection. This increased voltage drop prevents additional hogging of current which would result in the destruction of the junction.

FIG. 5 is a further alternative embodiment of the invention which is substantially similar to FIG. 4. That is, the embodiment of the invention illustrated in FIG. 5 has an emitter comb 13 of the type illustrated in FIG. 1; however, the base comb 14 is similar to the emitter comb illustrated in FIG. 4 in that it has extended teeth 21. The combs interlock at their teeth in the manner illustrated in connection with FIG. 4. The extended length 37 of the base teeth 21 is between the semiconductor structure 11 and the back of the comb 14. This increased length provides a ballasting inductance between the back of the base comb 14 and the semiconductor 11. This inductance results in a voltage drop to compensate for a junction hogging current.

Figure 6:
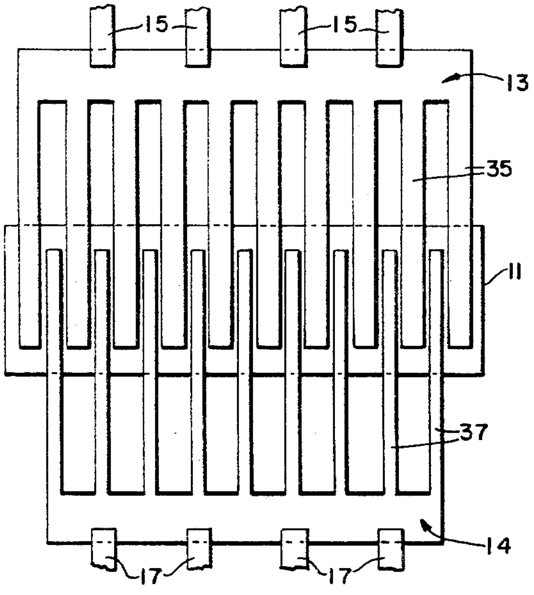
FIG. 6 is a pictorial diagram illustrating a fourth embodiment of the invention.

The embodiment of the invention illustrated in FIG. 6 is a combination of that illustrated in FIGS. 4 and 5. The embodiment illustrated in FIG. 6 comprises an emitter comb 13 and a base comb 14 wherein both the emitter comb and the base comb have extended teeth. That is, a portion of the comb teeth extends between the semiconductor structure 11 and the backs of the combs to provide an inductive voltage drop to compensate for junctions hogging current.

It will be appreciated by those skilled in the art and others that the foregoing has described a simple method (i.e., increasing the inductance of the leads to the junctions in a multiple junction transistor) and a similarly simple apparatus for carrying out the method. The apparatus comprises either breaking a conventional comb contact structure into a plurality of segments or increasing the length of the comb teeth. Either structure is a means for providing lead inductance to the junctions of a multiple junction transistor structure. This lead inductance decreases the voltage across the emitter to base junction when one of the junctions hogs current. This increase in voltage drop prevents a further increase in current hogging and prevents the destruction of the semiconductor junctions.

The foregoing has described preferred embodiments of the apparatus of the invention. It will be appreciated by those skilled in the art that other similar means may be utilized to carry out the method of the invention. Hence, the invention may be practiced otherwise than as specifically described herein.

What is claimed is:

1. In apparatus for connecting semi-conductive regions of a multiple junction transistor to bus bars, the improvement comprising:

a plurality of pairs of separate U-shaped contact members, each said U-shaped contact member being affixed to a semi-conductive region of said transistor, said U-shaped member further having two spaced homogeneous electrically continuous legs connected by a similarly homogeneous bridging member, each said U-shaped member having one of said legs interposed between said legs of the other U-shaped member of said pair;

a plurality of lead means, one end of each of said lead means being connected to a separate one of said U-shaped members, the other end of each of said lead means being connected to a said bus bar, said lead means being of a predetermined long length, said predetermined length being determined as a function of frequency and distributed inductance to cause a ballasting voltage drop to counteract destructive current hogging.

2. Apparatus as defined in claim 1 wherein said lead means are substantially 40 mils in length and 1 mil in diameter for operation at 430 megacycles.

References Cited

UNITED STATES PATENTS

| | | | |
|---|---|---|---|
| 2,721,965 | 10/1955 | Hall | 317—234 |
| 2,849,665 | 8/1958 | Boyer et al. | 317—235 |
| 3,336,508 | 8/1967 | Preletz et al. | 317—235 |

JOHN W. HUCKERT, *Primary Examiner.*

JERRY D. CRAIG, *Assistant Examiner.*

U.S. Cl. X.R.

29—591; 317—234